(12) United States Patent
Song et al.

(10) Patent No.: US 12,543,447 B2
(45) Date of Patent: Feb. 3, 2026

(54) DISPLAY PANEL, MANUFACTURING METHOD THEREOF AND DISPLAY APPARATUS

(71) Applicant: BOE Technology Group Co., Ltd., Beijing (CN)

(72) Inventors: Youngsuk Song, Beijing (CN); Wei Liu, Beijing (CN); Hongda Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 543 days.

(21) Appl. No.: 18/022,312

(22) PCT Filed: Jun. 24, 2022

(86) PCT No.: PCT/CN2022/101039
§ 371 (c)(1),
(2) Date: Feb. 21, 2023

(87) PCT Pub. No.: WO2023/245599
PCT Pub. Date: Dec. 28, 2023

(65) Prior Publication Data
US 2024/0292662 A1    Aug. 29, 2024

(51) Int. Cl.
*H10K 59/122*    (2023.01)
*H10K 59/12*    (2023.01)
(Continued)

(52) U.S. Cl.
CPC ....... *H10K 59/122* (2023.02); *H10K 59/1201* (2023.02); *H10K 59/124* (2023.02);
(Continued)

(58) Field of Classification Search
CPC . H10K 59/122; H10K 59/1201; H10K 59/124
(Continued)

(56) References Cited

U.S. PATENT DOCUMENTS

| 2018/0197929 A1* | 7/2018 | Cho | H10K 50/854 |
| 2021/0217839 A1* | 7/2021 | Choi | H10K 59/122 |
| 2023/0078043 A1* | 3/2023 | Kim | H10K 59/131 |
| | | | 257/40 |

FOREIGN PATENT DOCUMENTS

| CN | 203013729 U | 6/2013 |
| CN | 108511621 A | 9/2018 |

(Continued)

*Primary Examiner* — Xia L Cross
(74) *Attorney, Agent, or Firm* — Nath, Goldberg & Meyer; Joshua B. Goldberg

(57) ABSTRACT

The present disclosure provides a display panel, a manufacturing method thereof. The display panel includes: a display substrate, and a planarization layer, a pixel defining layer and a light emitting device on the display substrate. The light emitting device includes a first electrode, a second electrode and an organic functional layer, wherein the first electrode and the second electrode are oppositely arranged, and the organic functional layer is between the first electrode and the second electrode; a separation groove is formed in the planarization layer between the light emitting region and the transparent region; at least a portion of the pixel defining layer is in the separation groove; both of the first electrode and the second electrode extend to the separation groove from the light emitting region and stop at the separation groove; the organic functional layer is located within a region defined by the pixel defining layer.

20 Claims, 8 Drawing Sheets

(51) Int. Cl.
*H10K 59/124* (2023.01)
*H10K 59/80* (2023.01)

(52) U.S. Cl.
CPC . *H10K 59/80517* (2023.02); *H10K 59/80518* (2023.02); *H10K 59/873* (2023.02)

(58) Field of Classification Search
USPC .......................................................... 257/40
See application file for complete search history.

(56) References Cited

FOREIGN PATENT DOCUMENTS

| | | | |
|---|---|---|---|
| CN | 108598115 | A | 9/2018 |
| CN | 110148621 | A | 8/2019 |
| CN | 110518053 | A | 11/2019 |
| CN | 110620133 | A | 12/2019 |
| CN | 110783382 | A | 2/2020 |
| CN | 112820841 | A | 5/2021 |
| CN | 113314567 | A | 8/2021 |
| CN | 114122278 | A | 3/2022 |
| CN | 114156325 | A | 3/2022 |
| CN | 114242755 | A | 3/2022 |

* cited by examiner

1

DISPLAY PANEL, MANUFACTURING METHOD THEREOF AND DISPLAY APPARATUS

This is a National Phase Application filed under 35 U.S.C. 371 as a national stage of PCT/CN2022/101039, filed Jun. 24, 2022, the contents of which are hereby incorporated by reference in its entirety.

TECHNICAL FIELD

The present disclosure relates to the technical field of display, and in particular, to a display panel, a manufacturing method thereof and a display apparatus.

BACKGROUND

Organic Light Emitting Diodes (OLEDs) is light emitting devices using an organic solid semiconductor as a light emitting material, and has a wide application prospect due to its advantages such as simple manufacturing process, low cost, low power consumption, high luminance, wide operation temperature, and the like.

With the continuous development of display technology, transparent display technology has become an important personalized field in display technology. The transparent display is a display in which a display apparatus in a transparent state displays an image, so that a viewer can see not only an image in the display apparatus but also a scene behind the display apparatus.

SUMMARY

The present disclosure intends to solve at least one of the technical problems existing in the prior art, and provides a display panel, a manufacturing method thereof and a display apparatus.

As a first aspect, an embodiment provides a display panel having a plurality of display regions, each of the display regions having a light emitting region and a transparent region; wherein the display panel includes a display substrate, and a planarization layer, a pixel defining layer and a light emitting device on the display substrate; the light emitting device includes a first electrode, a second electrode and an organic functional layer, the first electrode and the second electrode being opposite to each other, and the organic functional layer being between the first electrode and the second electrode. A separation groove is in the planarization layer between the light emitting region and the transparent region, at least a portion of the pixel defining layer is in the separation groove, both of the first electrode and the second electrode extend to the separation groove from the light emitting region and stops at the separation groove, and the organic functional layer is in a region defined by the pixel defining layer.

Optionally, the first electrode covers a sidewall of the separation groove proximal to the light emitting region, and the second electrode covers a sidewall of the separation groove proximal to the transparent region.

Optionally, the display panel further includes a first barrier layer, a second barrier layer and a third barrier layer; wherein the first barrier layer is on a side of the pixel defining layer proximal to the first electrode, the second barrier layer is on a side of the pixel defining layer proximal to the organic functional layer, and the third barrier layer is on a side of the pixel defining layer proximal to the second electrode.

Optionally, a sum of heights of the first and second barrier layers is less than or equal to a height of the pixel defining layer, and a height of the third barrier layer is less than or equal to the height of the pixel defining layer.

Optionally, each of a corner portion of the second barrier layer and a corner portion of the third barrier layer away from the display substrate has an unfilled corner structure.

Optionally, the display panel further includes a first encapsulation layer covering the second electrode and a second encapsulation layer stacked on the first encapsulation layer, wherein the first encapsulation layer extends to the separation groove from the light emitting region and stops at the separation groove, and the second encapsulation layer extends to the transparent region from the light emitting region.

Optionally, the light emitting region has a reflective light emitting region and a transparent light emitting region, and the first electrode includes a reflective layer and a transparent conductive layer on a side of the reflective layer away from the display substrate, the reflective layer being in the reflective light emitting region, and the transparent conductive layer being in both of the reflective light emitting region and the transparent light emitting region.

Optionally, a material of the reflective layer includes at least one of silver, aluminum, and copper, and a material of the transparent conductive layer includes at least one of indium tin oxide and indium zinc oxide.

Optionally, the display substrate includes a base substrate and a driving circuit layer on the base substrate, and the driving circuit layer includes a plurality of thin film transistors in the reflective light emitting region.

Optionally, each of orthographic projections of the plurality of thin film transistors on the base substrate is within an orthographic projection of the reflective layer on the base substrate.

Optionally, each of the thin film transistors includes a plurality of insulating layers that stop at a position between the reflective light emitting region and the transparent light emitting region.

Optionally, the display panel further includes a cover plate on a side of the second encapsulation layer away from the display substrate.

As a second aspect, an embodiment of the present disclosure provides a display apparatus including the display panel described above.

As a third aspect, an embodiment of the present disclosure provides a method for manufacturing a display panel, the display panel having a plurality of display regions, and each of the plurality of display regions having a light emitting region and a transparent region; wherein the method includes: forming a planarization layer on a display substrate, and etching a portion of the planarization layer between the light emitting region and the transparent region to form a separation groove; forming a first electrode on the planarization layer such that the first electrode stops at the separation groove; forming a pixel defining layer in the separation groove; forming an organic functional layer in a region defined by the pixel defining layer; forming a second electrode on the organic functional layer; and removing a portion of the second electrode in the transparent region such that the second electrode stops at the separation groove.

Optionally, before forming the pixel defining layer in the separation groove, the method further includes forming a first barrier layer on the first electrode in the separation groove.

Optionally, after forming the pixel defining layer in the separation groove, the method further includes forming a second barrier layer and a third barrier layer on the pixel defining layer, such that the second barrier layer covers a side surface of the pixel defining layer proximal to the light emitting region and the third barrier layer covers a side surface of the pixel defining layer proximal to the transparent region.

Optionally, after forming the second electrode on the organic functional layer, the method further includes forming a first encapsulation layer on the second electrode; removing portions of the first encapsulation layer and the second electrode in the transparent region; and forming a second encapsulation layer on the first encapsulation layer.

Optionally, forming the organic functional layer in the region defined by the pixel defining layer includes forming the organic functional layer by using a fine metal mask plate.

Optionally, forming the organic functional layer in the region defined by the pixel defining layer includes forming the organic functional layer through an ink-jet printing process.

Optionally, after forming the second encapsulation layer on the first encapsulation layer, the method includes attaching a cover plate to the second encapsulation layer.

DETAIL DESCRIPTION OF EMBODIMENTS

In order to enable those skilled in the art to better understand the technical solution of the present disclosure, a further detailed description of the present disclosure will be illustrated in combination with the accompanying drawings and specific embodiments.

Unless defined otherwise, technical or scientific terms used herein shall have the ordinary meaning as understood by one of ordinary skill in the art to which this disclosure belongs. The use of "first," "second," and the like in this disclosure is not intended to indicate any order, quantity, or importance, but rather is used to distinguish one element from another. Also, the use of the terms "a" "an" or "the" and similar referents do not denote a limitation of quantity, but rather denote the presence of at least one. The word "include" or "comprise", and the like, means that the element or item preceding the word comprises the element or item listed after the word and its equivalent, but does not exclude other elements or items. The terms "connect" or "couple" and the like are not restricted to physical or mechanical connections, but may include electrical connections, whether direct or indirect. "Upper", "lower". "left". "right", and the like are used only to indicate relative positional relationships, and when the absolute position of the object being described is changed, the relative positional relationships may also be changed accordingly.

Figure 1:
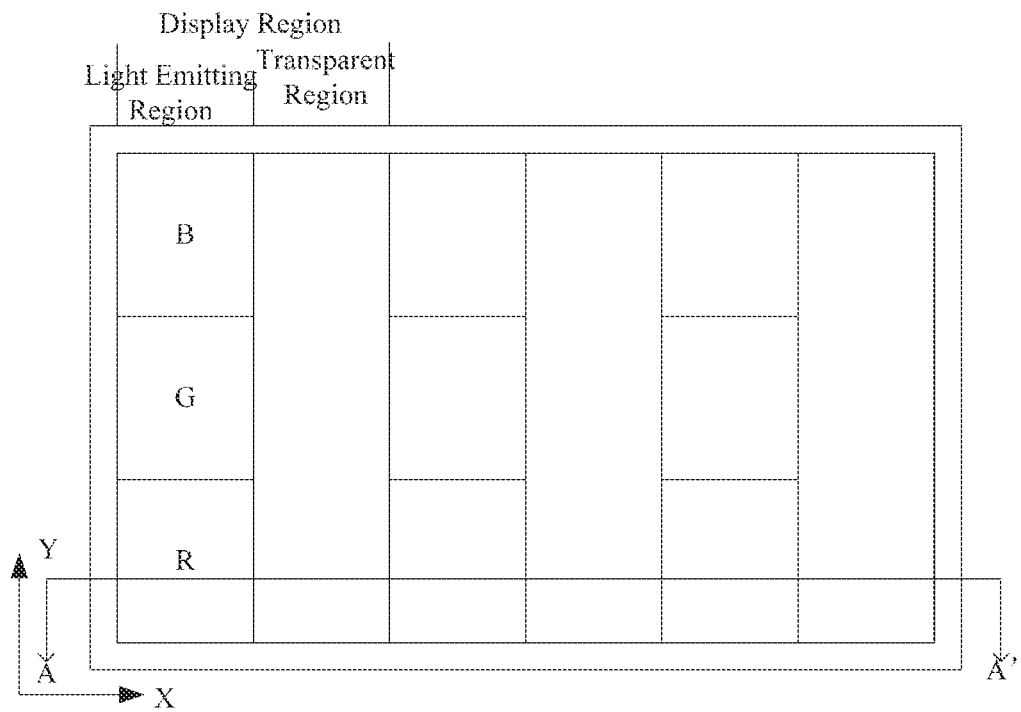
FIG. 1 is a schematic diagram showing a structure of an exemplary display panel.
Figure 2:
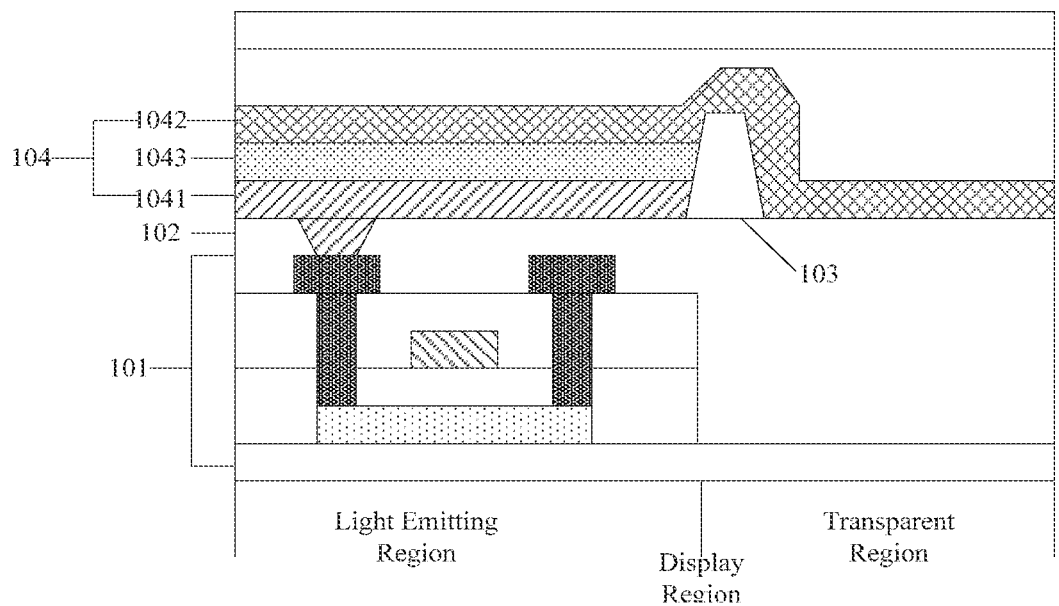
FIG. 2 is a schematic cross-sectional view of the display panel shown in FIG. 1 along line A-A'.

FIG. 1 is a schematic diagram showing a structure of an exemplary display panel. As shown in FIG. 1, the display panel has a plurality of display regions. Each of the display regions includes a light emitting region and a transparent region which are arranged along a first direction, for example, an X direction. FIG. 2 is a schematic cross-sectional view showing a structure of the display panel shown in FIG. 1 along line A-A'. As shown in FIG. 1 and FIG. 2, the display panel includes: a display substrate 101, and a planarization layer 102, a pixel defining layer 103, and a light emitting device 104 disposed in this order on the display substrate. The light emitting device 104 may specifically be a red light emitting device R, a green light emitting device G, or a blue light emitting device B. The light emitting devices 104 in different colors are arranged along a second direction, for example, a Y direction.

With continued reference to FIG. 2, the light emitting device 104 includes: a first electrode 1041 and a second electrode 1042 which are oppositely arranged, and an organic functional layer 1043 between the first electrode 1041 and the second electrode 1042. The first electrode 1041 is located on the planarization layer 102 and is electrically connected to the display substrate through a via hole penetrating through the planarization layer 102. The organic functional layer 1043 is located in a region defined by the pixel defining layer 103. The organic functional layer 1043 can emit red light, blue light, or blue light under the driving of the electric field generated by the first electrode 1041 and the second electrode 1042, so as to realize color display. The second electrode 1042 is generally a whole conductive layer made of a transparent material, and has a transparency about 90%, but the structures in the transparent region still affect the transparency of the whole display panel.

At present, the transparency of the display panel is often improved by simplifying the layer structure in the transparent region, for example, a portion of the second electrode 1042 in the transparent region is removed through an etching process. However, while the layer structure in the transparent region is simplified, moisture or oxygen is prone to intrude through the organic layer in the display panel during the etching process, which causes the organic functional layer of the light emitting device to be corroded, thereby causing the reduction of the service life and reliability of the display panel, and affecting the display effect.

In order to solve at least one of the above technical problems, embodiments of the present disclosure provide a display panel, a method for manufacturing the display panel, and a display apparatus which will be described below in combination with the drawings and specific embodiments.

Figure 3:
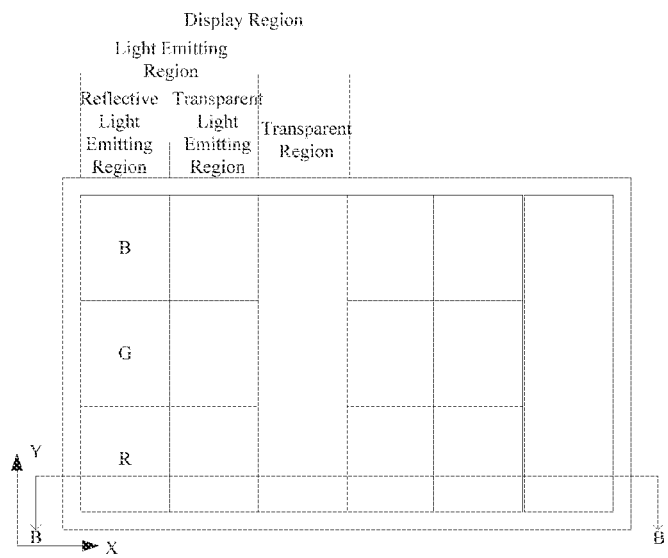
FIG. 3 is a schematic diagram showing a structure of a display panel according to an embodiment of the present disclosure.
Figure 4:
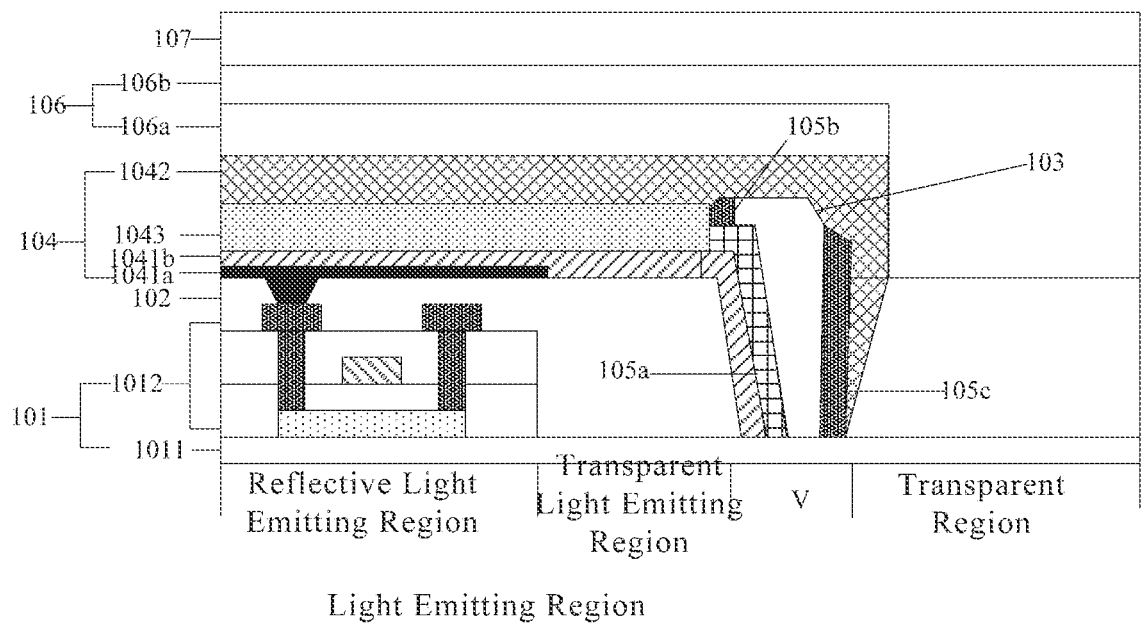
FIG. 4 is a schematic cross-sectional view of the display panel shown in FIG. 3 along line B-B'.

In a first aspect, an embodiment of the present disclosure provides a display panel. FIG. 3 is a schematic diagram showing a structure of the display panel provided in an embodiment of the present disclosure. As shown in FIG. 3, the display panel has a plurality of display regions. Each of the display regions includes a light emitting region and a transparent region that are arranged along a first direction, for example, an X direction. FIG. 4 is a schematic cross-sectional view showing a structure of the display panel shown in FIG. 3 along line B-B'. As shown in FIG. 3 and FIG. 4, the display panel includes: a display substrate 101, and a planarization layer 102, a pixel defining layer 103, and a light emitting device 104 disposed in this order on the display substrate 101. The light emitting devices 104 in different colors are arranged along a second direction, for example, the Y direction. The light emitting device 104 includes a first electrode 1041 and a second electrode 1042 which are oppositely arranged, and an organic functional layer 1043 between the first electrode 1041 and the second electrode 1042. A separation groove V is formed in the planarization layer 102 between the light emitting region and the transparent region. At least a portion of the pixel defining layer 103 is disposed in the separation groove V; the first electrode 1041 and the second electrode 1042 both extend to the separation groove from the light emitting region and stops at the separation groove. The organic functional layer 1043 is located within a region defined by the pixel defining layer 103.

It should be noted that, the number of the light emitting devices 104 in the light emitting region in the embodiment of the present disclosure is three or four, which is not limited thereto. The plurality of sub-pixels in the light emitting region 100 in the embodiment of the present disclosure are arranged in parallel in the first direction (i.e., the X direction) or the second direction (i.e., the Y direction), or any three sub-pixels may be arranged in a zigzag manner, or any four sub-pixels may be arranged in two rows and two columns, which is not limited thereto herein.

The display substrate 101 may be an array substrate on which a pixel driving circuit is disposed. The pixel driving circuit may provide a driving voltage to the first electrode 1041 of the light emitting device 104, so that the light emitting device 104 emits red light, green light, or blue light, thereby implementing color display. It should be noted that the circuit structure of the pixel driving circuit in the array substrate may be the same as the structure of the pixel driving circuit in the related art, for example, the pixel driving circuit may be a 7T1C pixel driving circuit, an 8T1C pixel driving circuit, or a 7T2C pixel driving circuit, and the specific structure thereof will not be described again.

The planarization layer 102 may be formed of an organic material such as acryl resin, Polyimide (PI), benzocyclobutene (BCB), or the like. The planarization layer 102 is configured to planarize a surface of the array substrate to provide a flat surface for other layers on the array substrate (e.g., the first electrode 1041 of the light emitting device 104), which is beneficial for the adhesion between the array substrate and the other layers. A separation groove is formed in the planarization layer 102 between the light emitting region and the transparent region. The separation groove may separate the planarization layer 102 in the light emitting region from the planarization layer 102 in the transparent region, so as to prevent moisture or oxygen from entering the organic functional layer of the light emitting device 104 through the planarization layer 103.

The pixel defining layer 103 is made of an organic material such as Polyimide (PI), Polyamide (PA), benzocyclobutene (BCB), acryl resin, or phenol resin, or the like. Specifically, the pixel defining layer 103 may include a plurality of pixel banks, and a pixel aperture may be formed between adjacent ones of the pixel banks. The pixel aperture may expose the first electrode 1041 of the light emitting device 104 to provide a carrying space for the organic functional layer 1043 of the light emitting device 104.

The first electrode 1041 and the second electrode 1042 have opposite polarities. For example, the first electrode 1041 may specifically be an anode of the light emitting device 104, and the anode may be made of at least one of metal materials such as silver (Ag), aluminum (Al), and titanium (Ti). The second electrode 1042 may be specifically a cathode of the light emitting device 104, and the cathode may be made of a transparent conductive material such as Indium Tin Oxide (ITO) or Indium Zinc Oxide (IZO), so as to improve the transparency of the overall display panel. Each of the anode and the cathode may have a single-layer structure made of a single material or of a multi-layer structure made of multiple materials, which can be selected according to actual needs. The anode and the cathode extend to the separation groove from the light emitting region and stops at the separation groove. The anode covers a sidewall of the separation groove proximal to the light emitting region, and the cathode covers a sidewall of the separation groove proximal to the transparent region. In this case, no anode and cathode is formed in the transparent region, thereby avoiding the blocking of light by the anode and cathode in the transparent area, and thus improving the transparency of the display panel.

The organic functional layer 1043 may include an organic light emitting layer, which may be formed of an organic light emitting material with a small molecular weight or a polymer organic light emitting material, and the organic functional layer 1043 may emit light under the driving of an electric field between the anode and the cathode. In addition to the organic light emitting layer described above, the organic functional layer 1043 may include other functional layers such as at least one of a Hole Injection Layer (HIL), a Hole Transport Layer (HTL), an Electron Transport Layer (ETL), and an Electron Injection Layer (EIL).

In the display panel in the embodiment of the present disclosure, the first electrode 1041 and the second electrode 1042 of the light emitting device 104 may extend from the light emitting region to the separation groove and stops at the separation groove. It is unnecessary to form the first electrode 1041 and the second electrode 1042 in the transparent region, so that it can prevent the first electrode 1041 and the second electrode 1042 from shielding the light, and transparency of the display panel can be improved. Moreover, the separation grooves may separate the planarization layer 102 in the light emitting region from the planarization layer 102 in the transparent region, so as to prevent moisture or oxygen from entering into the organic functional layer of the light emitting device 104 through the planarization layer 102. Thus, the reliability and the service life of the display panel can be improved, and the display effect of the display panel can be improved too.

In some embodiments, the first electrode 1041 covers a sidewall of the separation groove V proximal to the light emitting region, and the second electrode 1042 covers a sidewall of the separation groove V proximal to the transparent region.

In some embodiments, the first electrode 1041 may also cover the bottom of the separation groove V and/or cover a sidewall of the separation groove V proximal to the transparent region.

In some embodiments, the second electrode 1042 may also cover the bottom of the separation groove V.

The first electrode 1041 and the second electrode 1042 are made of inorganic materials, and may cover two sidewalls of the separation groove V, so as to further prevent moisture or oxygen from entering an organic functional layer of the light emitting device 104 through the planarization layer 102. Thus, the reliability and the service life of the display panel can be improved, and the display effect of the display panel can be improved.

In some embodiments, the display panel further includes a first barrier layer 105a, a second barrier layer 105b, and a third barrier layer 105c. The first barrier layer 105a is on a side of the pixel defining layer 103 proximal to the first electrode 1041, the second barrier layer 105b is on a side of the pixel defining layer 103 proximal to the organic functional layer 1043, and the third barrier layer 105c is on a side of the pixel defining layer 103 proximal to the second electrode 1042.

The first barrier layer 105a is on a side of the pixel defining layer 103 proximal to the first electrode 1041, the second barrier layer 105b is on a side of the pixel defining layer 103 proximal to the organic functional layer 1043, and the third barrier layer 105c is on a side of the pixel defining layer 103 proximal to the second electrode 1042. Each of the first barrier layer 105a, the second barrier layer 105b, and the third barrier layer 105c is made of an inorganic insulating material, such as at least one of silicon nitride, silicon oxide, and silicon oxynitride. The first barrier layer 105a, the second barrier layer 105b, and the third barrier layer 105c surround the side surfaces of the pixel defining layer 103 so as to prevent moisture or oxygen from entering into the organic functional layer of the light emitting device 104 via the pixel defining layer 103. Thus, the reliability and the service life of the display panel can be improved, and the display effect of the display panel can be improved.

In some embodiments, a sum of the heights of the first barrier layer 105a and the second barrier layer 105b is less than or equal to a height of the pixel defining layer 103; a height of the third barrier layer 105c is less than or equal to the height of the pixel defining layer 103.

The sum of the heights of the first barrier layer 105a and the second barrier layer 105b is less than or equal to the height of the pixel defining layer 103, and the height of the third barrier layer 105c is less than or equal to the height of the pixel defining layer 103, so as to prevent the second electrode 1042 on the pixel defining layer 103 from being warped or crimped due to the heights of the barrier layers higher than that of the pixel defining layer 103, thereby ensuring the flatness of the second electrode 1042 on the pixel defining layer 103, and thus improving the display effect.

In some embodiments, a corner, on a side of the second barrier layer 105b and the third barrier layer 105c away from the display substrate 101, of each of the second barrier layer 105b and the third barrier layer 105c is an unfilled corner.

The corner of each of the second barrier layer 105b and the third barrier layer 105c are designed to be the unfilled corner, so as to avoid the second electrode 1042 being punctured by the sharp corner, thereby ensuring the flatness of the second electrode 1042, and thus improving the display effect. It is understood that the corners of the second barrier layer 105b and the third barrier layer 105c may be designed to be a gently curved corners or other shapes, which are not listed here.

In some embodiments, as shown in FIG. 4, the display panel further includes: a first encapsulation layer 106a covering the second electrode 1042 and a second encapsulation layer 106b stacked on the first encapsulation layer 106a. The first encapsulation layer 106a extends from the light emitting region to the separation groove and stops at the separation groove, and the second encapsulation layer 106b extends from the light emitting region to the transparent region.

Each of the first and second encapsulation layers 106a and 106b may have a single structure of an inorganic material, or a stacked structure of an organic material layer, an inorganic material layer, and an organic material layer. The first encapsulation layer 106a may encapsulates the layers in the light emitting region to prevent moisture or oxygen from entering the organic functional layer 1043 of the light emitting device 104. The second encapsulation layer 106b encapsulates the entire display panel. Meanwhile, only the first encapsulation layer 106a is disposed in the transparent region, so that the structure of the layers in the transparent region of the display panel can be simplified, and the transparency of the transparent region of the display panel can be further improved.

In some embodiments, as shown in FIG. 3 and FIG. 4, the light emitting region has a reflective light emitting region and a transparent light emitting region. The first electrode 1041 includes a reflective layer 1041a and a transparent conductive layer 1041b on a side of the reflective layer 1041a away from the display substrate 101. The reflective layer 1041a is disposed in the reflective light emitting region, and the transparent conductive layer 1041b is disposed in both of the reflective light emitting region and the transparent light emitting region.

The reflective layer 1041a may be disposed in the reflective light emitting region, and may reflect light emitted from the organic functional layer 1043, so that the light is emitted out from the second electrode 1042, thereby improving light emitting efficiency of the light, and further improving light emitting efficiency of the light emitting device 104.

The transparent conductive layer 1041b is disposed in both of the reflective light emitting region and the transparent light emitting region. When the organic functional layer 1043 emits light, the light can be emitted out from the second electrode 1042. When the organic functional layer 1043 does not emit light, the transparent conductive layer is in a transparent state, and thus the transparent light emitting region of the display panel is in a transparent state, so that the transparency of the display panel can be further improved.

Specifically, the material of the reflective layer 1041a may adopt at least one of silver, aluminum, and copper, and the material of the transparent conductive layer 1041b may be at least one of indium tin oxide and indium zinc oxide. The transparent conductive layer 1041b may have a single-layer structure or a multi-layer structure. The second electrode 1042 may be made of material with high transparency and low resistance such as Indium Tin Oxide (ITO), Indium Zinc Oxide (IZO), silver nanowire (AgNW), or Carbon Nanotube (CNT).

In some embodiments, as shown in FIG. 4, the display substrate 101 includes: a base substrate 1011, a driving circuit layer 1012 on the base substrate 1011. The driving circuit layer 1012 includes: a plurality of thin film transistors. The plurality of thin film transistors are arranged in the reflective light emitting region.

The base substrate 1011 may be made of rigid materials such as glass, so as to improve the bearing capacity of the base substrate 1011 to other layers thereon. Alternatively the base substrate 1011 may also be made of a flexible material such as Polyimide (PI), so as to improve the bending and tensile resistance of the display substrate 101, avoid the base substrate 1011 from being broken due to the stress generated during the bending, stretching and twisting processes, thereby preventing a poor open circuit from occurring. In practical applications, the material of the base substrate 1011 can be selected as needed to ensure that the display substrate 101 has good performance.

The driving circuit layer 1012 is provided therein with a pixel driving circuit for driving the light emitting device 104 to emit light, and the specific structure of the pixel driving circuit can refer to the structure of the pixel driving circuit in the related art, and will not be described in detail here. For example: as shown in FIG. 4, the driving circuit layer 1012 includes a plurality of thin film transistors, each of which includes: an active layer, a gate insulating layer, a gate electrode, an interlayer insulating layer, and a source electrode and a drain electrode sequentially stacked on the base substrate 1011. The source electrode and the drain electrode are electrically connected to both ends of the active layer through via holes penetrating the interlayer insulating layer and the gate insulating layer, respectively. The planarization layer 102 is configured to planarize the layer where the source and drain electrodes are located. The source is electrically connected to the first electrode 1041 of the light emitting device 104 through a via hole penetrating the planarization layer 102.

The active layer may be made of at least one of a metal oxide and a low-temperature polysilicon material. The gate insulating layer may be made of at least one of silicon nitride, silicon oxide and silicon oxynitride. The gate electrode may be made of at least one of copper, aluminum, molybdenum and nickel. The interlayer insulating layer may be made of at least one of silicon nitride, silicon oxide and silicon oxynitride. The source and the drain electrodes may be made of at least one of copper, aluminum, molybdenum and nickel.

The plurality of thin film transistors in the driving circuit layer 1012 are only disposed in the reflective light emitting region, so as to prevent the light in the transparent light emitting region and the transparent region from being shielded by the plurality of thin film transistors, thereby improving the transparency of the display panel.

In some embodiments, orthographic projections of the plurality of thin film transistors on the base substrate 1011 are within an orthographic projection of the reflective layer 1041*a* on the base substrate 1011.

The reflective layer 1041*a* as a light shielding layer shields the thin film transistor below the reflective layer from be irradiated by light. During the display process, on one hand, the reflective layer 1041*a* may reflect the light from the organic functional layer 1043, and may prevent the image of the thin film transistor from entering the field of view of the user, so as to improve the display effect of the display panel; on the other hand, a black matrix for shielding light does not need to be formed for the thin film transistor, so that the process steps can be reduced, the structure of the display panel can be simplified, and the manufacturing cost can be reduced.

In some embodiments, as shown in FIG. 4, the thin film transistor includes: a plurality of insulating layers that stop at a position between the reflective light emitting region and the transparent light emitting region.

The insulating layers of the thin film transistor may be a gate insulating layer, an interlayer insulating layer, or the like, and each of the insulating layers may be made of at least one of silicon nitride, silicon oxide, and silicon oxynitride. The transparency of the display panel is easily decreased by 10% or more due to the difference between the refractive indexes of the insulating layers. In the embodiment of the present disclosure, each of the insulating layers of the thin film transistor stops at a position between the reflective light emitting region and the transparent light emitting region, that is, each of the insulating layers of the thin film transistor does not extend into both of the transparent light emitting region and the transparent region, so that layer structure in both of the transparent light emitting region and the transparent region of the display panel can be simplified, and the decrease of transparency of the display panel due to the difference between the refractive indexes of the insulating layers can be avoided, thereby improving the transparency of the overall display panel. In some embodiments, as shown in FIG. 4, the separation groove V in the planarization layer has a depth approximately equal to a height from the base substrate 1011 to the reflective layer 1041*a*, that is, the lower opening of the separation groove V exposes the base substrate 1011, so that because of the separation groove V, the insulating layers in the thin film transistor stop at a position between the reflective light emitting region and the transparent light emitting region.

In some embodiments, as shown in FIG. 4, the pixel defining layer 103 formed in the separation groove has a height greater than a depth of the separation groove. For example, the separation groove is formed on the base substrate 1011, and the pixel defining layer 103 formed in the separation groove is closer to the base substrate 1011, so that not only the pixel defining layer 103 formed in the separation groove may support the layers above the pixel defining layer 103, but also a thickness of the display panel can be reduced (since the pixel defining layer 103 is generally formed on the planarization layer). Of course, with such a design, it is beneficial to better forming the first barrier layer 105*a*, the second barrier layer 105*b* and the third barrier layer 105*c*, and it is beneficial to cooperate with the first barrier layer 105*a*, the second barrier layer 105*b* and the third barrier layer 105*c* to prevent water and oxygen from entering the light emitting region and support the layers on the pixel defining layer 103.

In some embodiments, the materials of the first barrier layer 105*a*, the second barrier layer 105*b*, and the third barrier layer 105*c* are the same as each other.

The materials of the first barrier layer 105*a*, the second barrier layer 105*b* and the third barrier layer 105*c* are the same as each other. For example, the materials of the first barrier layer 105*a*, the second barrier layer 105*b* and the third barrier layer 105*c* may each be at least one of silicon oxide, silicon nitride and silicon oxynitride. During the manufacturing process, the first barrier layer 105*a*, the second barrier layer 105*b* and the third barrier layer 105*c* may be formed by the same manufacturing process, so that the process steps can be simplified, and the manufacturing cost can be reduced.

In some embodiments, the first barrier layer 105*a* is in direct contact with the second barrier layer 105*b*.

The first barrier layer 105*a* is in direct contact with the second barrier layer 105*b* and the materials of the first barrier layer 105*a* and the second barrier layer 105*b* are the same as each other, thereby preventing a gap from being generated between the first barrier layer 105*a* and the second barrier layer 105*b*, so that moisture or oxygen may be prevented from penetrating into the organic functional layer of the light emitting device 104 through the gap between the first barrier layer 105*a* and the second barrier layer 105*b*.

In some embodiments, the display panel further includes a cover plate 107 on a side of the second encapsulation layer 106*b* away from the display substrate 101.

The cover plate 107 can be made of transparent materials such as glass and acrylic, and can protect the layers in the display panel and specifically prevent the layers in the display panel from being damaged by external force during use.

It can be understood that in addition to the layers described above, the display panel in the embodiment of the present disclosure may further include the existing layers in the related art such as a touch layer and a polarizer layer, and the implementation principle of the display panel is the same as that in the related art, and therefore, detailed description thereof will not be repeated herein.

In a second aspect, an embodiment of the present disclosure provides a display apparatus including the display panel provided in any one of the above embodiments, and the display apparatus may be any product or component with display function, such as mobile phone, tablet computer, TV, computer display, notebook computer, digital photo frame, navigator, etc. Its realization principle and beneficial effect are the same as those of the above display panel, and will not be described herein.

Figure 5:
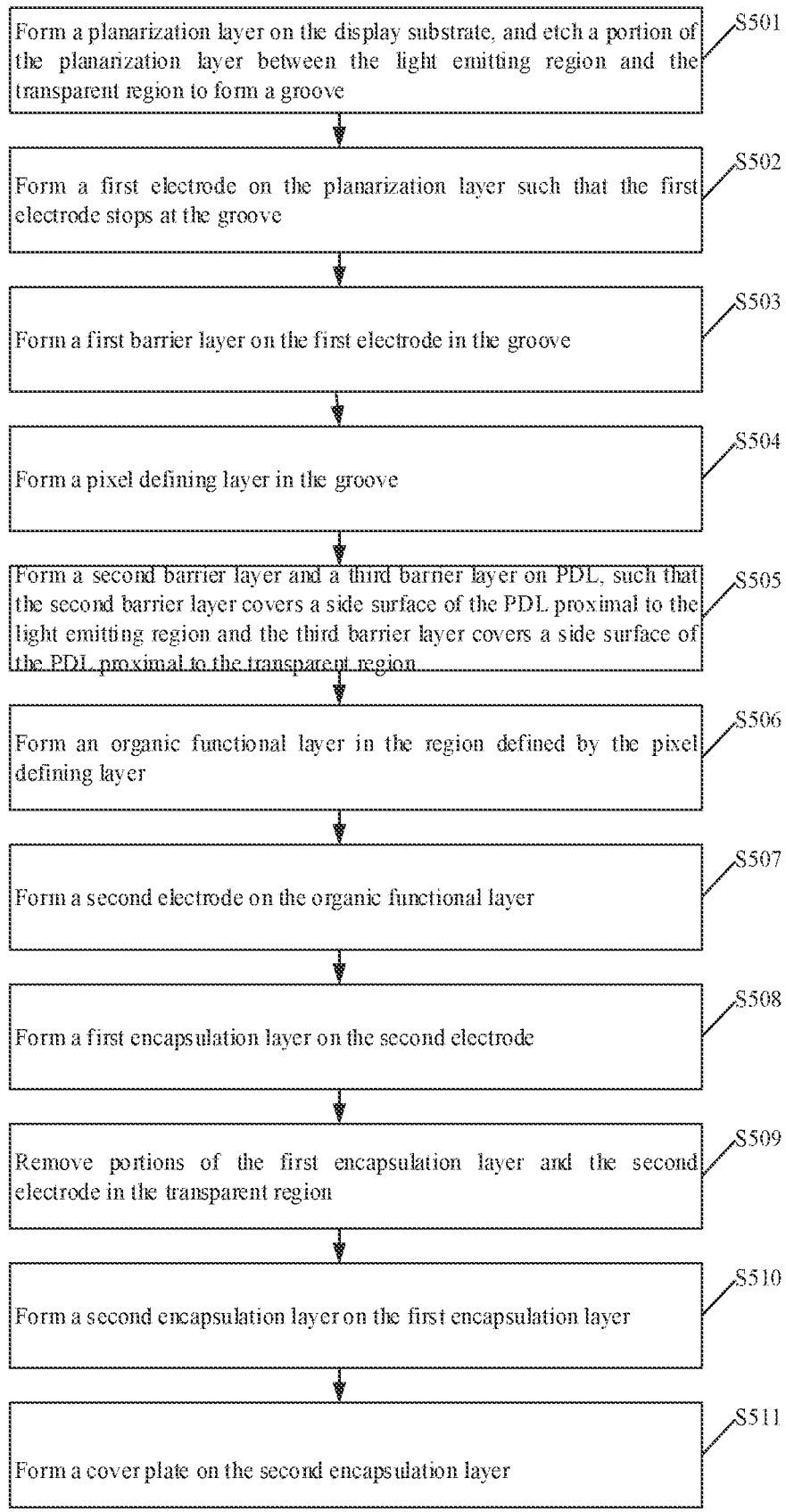
FIG. 5 is a schematic flowchart of a method for manufacturing a display panel according to an embodiment of the present disclosure.

In a third aspect, embodiments of the present disclosure provide a method for manufacturing a display panel, which is used to manufacture the display panel provided in any one of the above embodiments. The display panel has a plurality of display regions; each of the display regions includes: a light emitting region and a transparent region. FIG. 5 is a schematic flow diagram of a manufacturing method of a display panel according to an embodiment of the present disclosure, and FIG. 6a to FIG. 6k are schematic diagrams showing structures corresponding to the steps of the method for manufacturing the display panel shown in FIG. 5. As shown in FIG. 5, the method for manufacturing the display panel includes the following steps S501 to S511.

At step S501, a planarization layer is formed on the display substrate, and a portion of the planarization layer between the light emitting region and the transparent region is etched to form a separation groove.

Figure 6A:
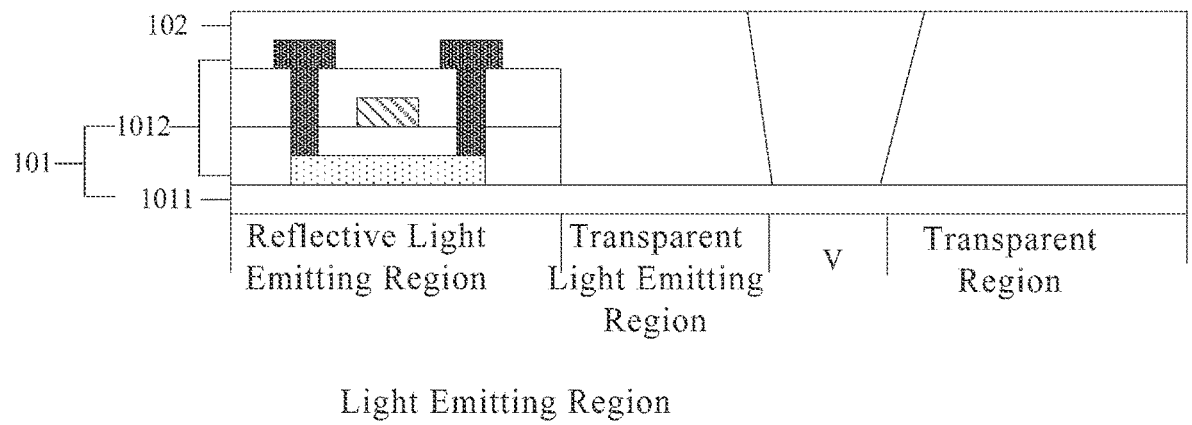
FIG. 6a to FIG. 6k are schematic diagrams showing structures corresponding to steps in the method for manufacturing the display panel shown in FIG. 5.

As shown in FIG. 6a, a driving circuit layer 1012 is firstly formed on a base substrate 1011 to form a display substrate 101; an organic material layer is deposited on the driving circuit layer 1012 to form a planarization layer 102; and a patterning process is performed on the planarization layer 102 by etching away a portion of the planarization layer 102 between a light emitting region and a transparent region, thereby forming a separation groove.

At step S502, a first electrode is formed on the planarization layer such that the first electrode stops at the separation groove.

Figure 6B:
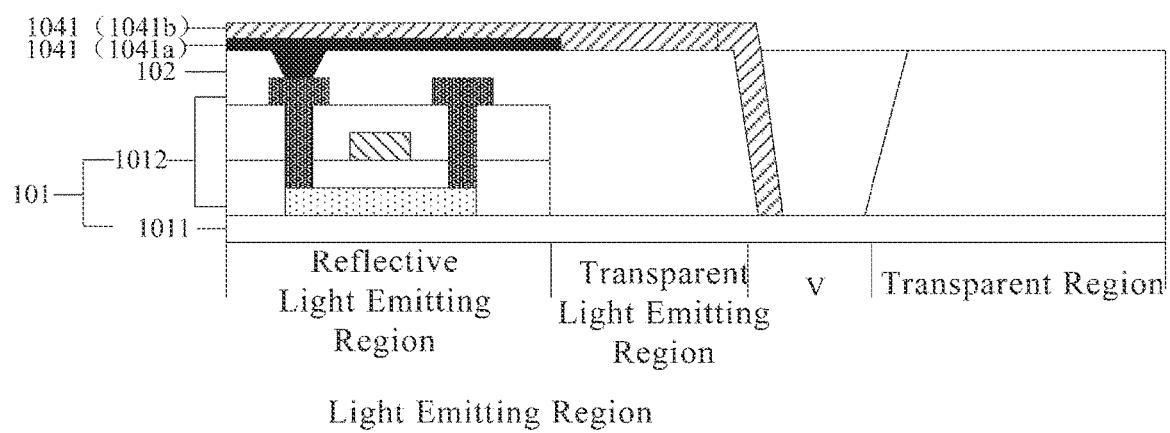

As shown in FIG. 6b, a first electrode 1041 is formed on the planarization layer 102; and a patterning process is performed on the first electrode 1041 such that the first electrode 1041 stops at the separation groove, so that the transparency of the transparent region cannot be affected.

At step S503, a first barrier layer is formed on the first electrode in the separation groove.

Figure 6C:
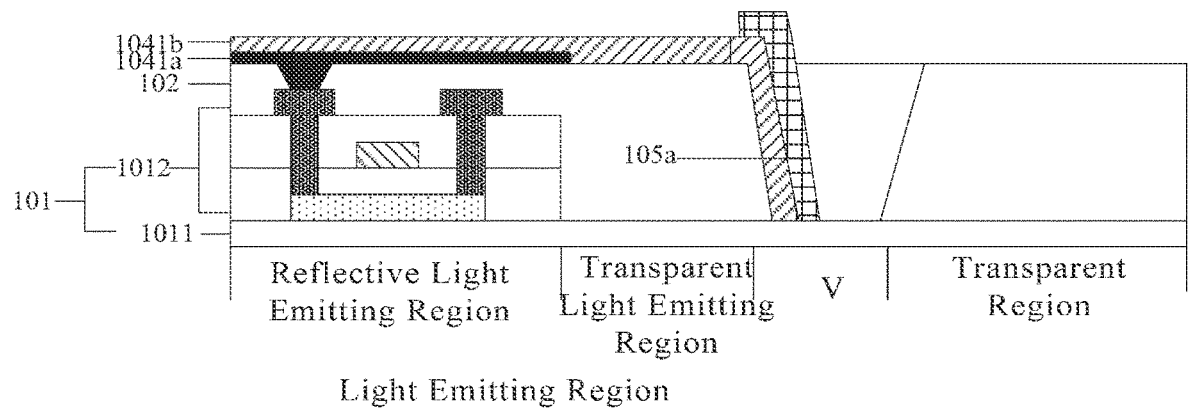

As shown in FIG. 6c, an inorganic material layer is deposited on the first electrode; and a patterning process is performed on the inorganic material layer to form a first barrier layer 105a, such that the first barrier layer 105a covers the first electrode 1041 in the separation groove.

At step S504, a pixel defining layer is formed in the separation groove.

Figure 6D:
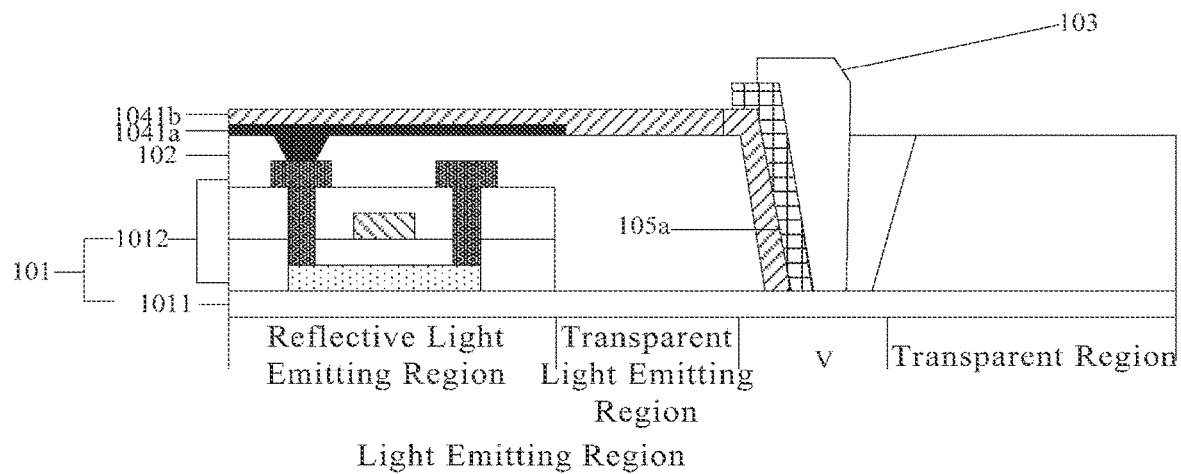

As shown in FIG. 6d, the pixel defining layer 103 is formed in the separation groove such that the pixel defining layer 103 covers the first barrier layer 105a.

At step S505, a second barrier layer and a third barrier layer are formed on the pixel definition layer, such that the second barrier layer covers a side surface of the pixel definition layer proximal to the light emitting region and the third barrier layer covers a side surface of the pixel definition layer proximal to the transparent region.

Figure 6E:
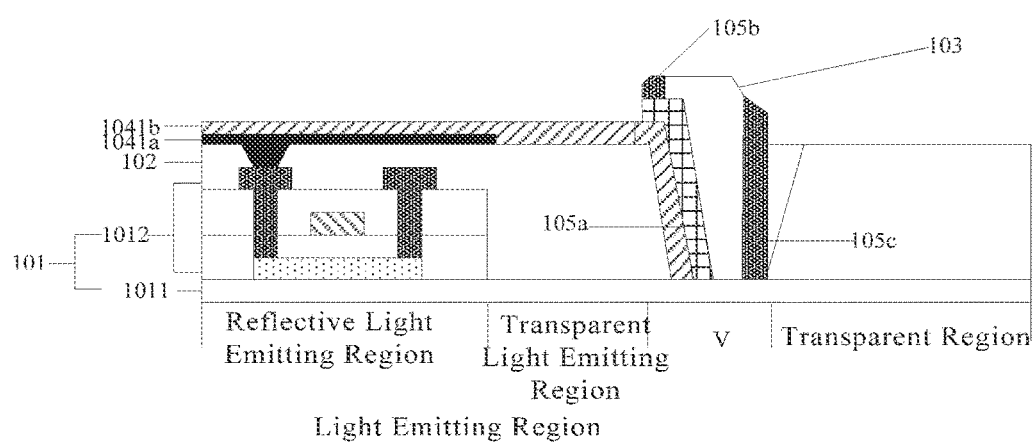

As shown in FIG. 6e, an inorganic material layer is formed on the pixel defining layer 103; and a patterning process is performed on the inorganic material layer to form a second barrier layer 105b and a third barrier layer 105c, such that the second barrier layer 105b covers a side surface of the pixel defining layer 103 proximal to the light emitting region and the third barrier layer 105c covers the side surface of the pixel defining layer 103 proximal to the transparent region.

At step S506, an organic functional layer is formed in the region defined by the pixel defining layer.

Figure 6F:
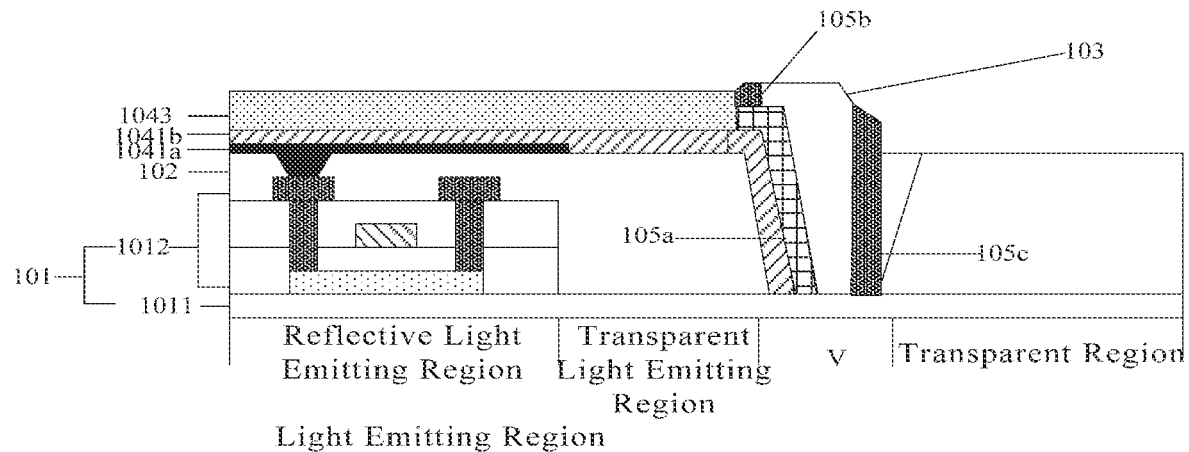

As shown in FIG. 6f, an organic light emitting material is injected into the region defined by the pixel defining layer 103 by using a high precision metal mask or through an inkjet printing process to form an organic functional layer 1043.

At step S507, a second electrode is formed on the organic functional layer.

Figure 6G:
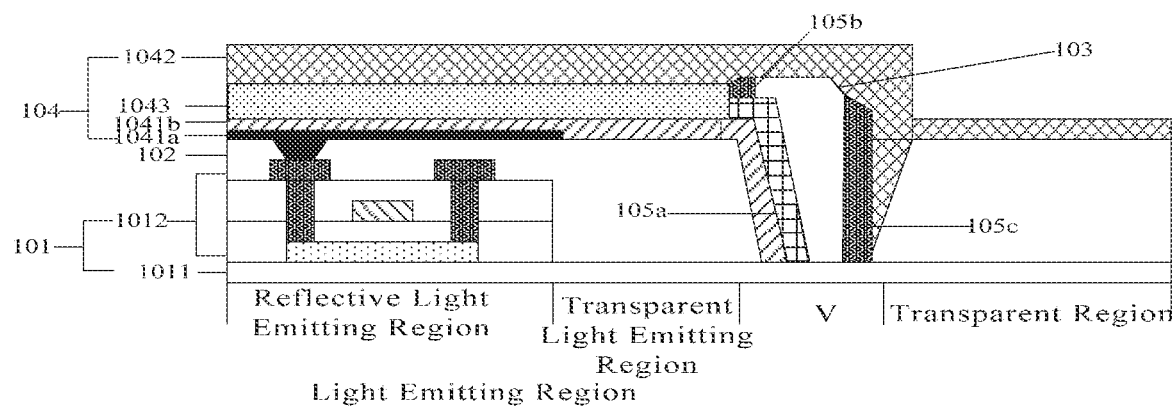

As shown in FIG. 6g, a conductive material is deposited on the organic functional layer 1043 to form a second electrode 1042.

At step S508, a first encapsulation layer is formed on the second electrode.

Figure 6H:
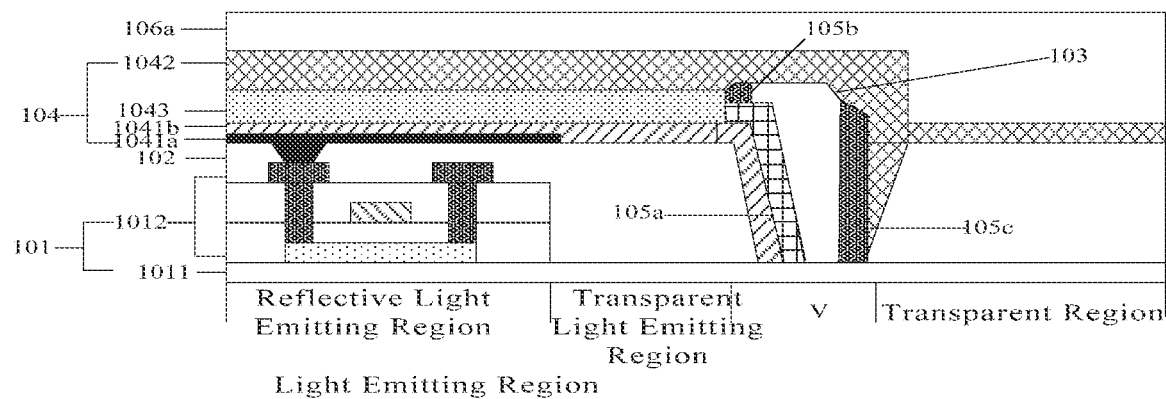

As shown in FIG. 6h, an inorganic material layer is deposited on the second electrode 1042 to form a first encapsulation layer 106a for encapsulating the light emitting devices 104, thereby preventing moisture or oxygen from penetrating into the organic functional layer 1043 of the light emitting device 104.

At step S509, portions of the first encapsulation layer and the second electrode in the transparent region are removed.

Figure 6I:
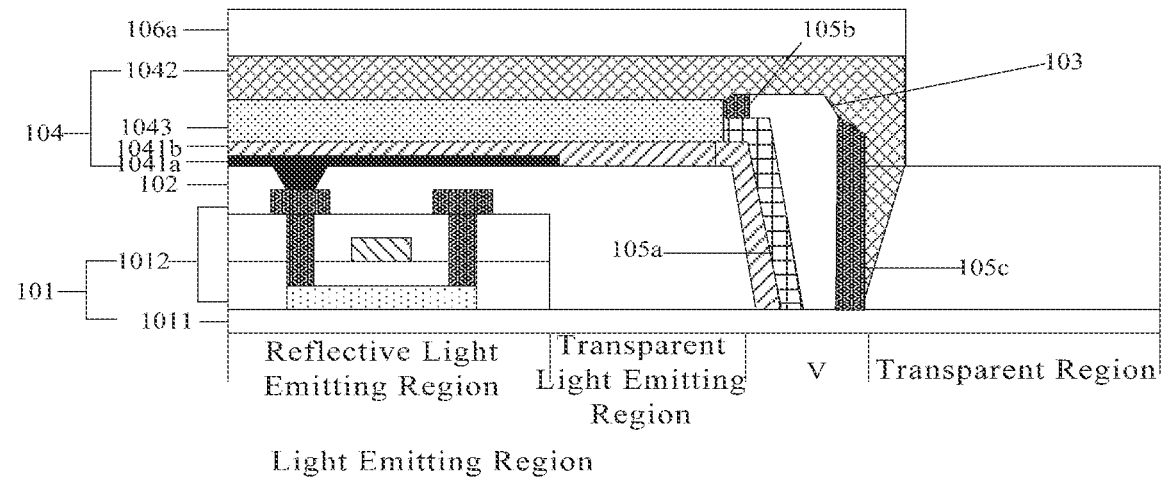

As shown in FIG. 6i, portions of the first encapsulation layer 106a and the second electrode 1042 in the transparent region are removed through an etching process, so that the structure of the transparent region of the display panel can be simplified and the transparency of the display panel can be improved.

At step S510, a second encapsulation layer is formed on the first encapsulation layer.

Figure 6J:
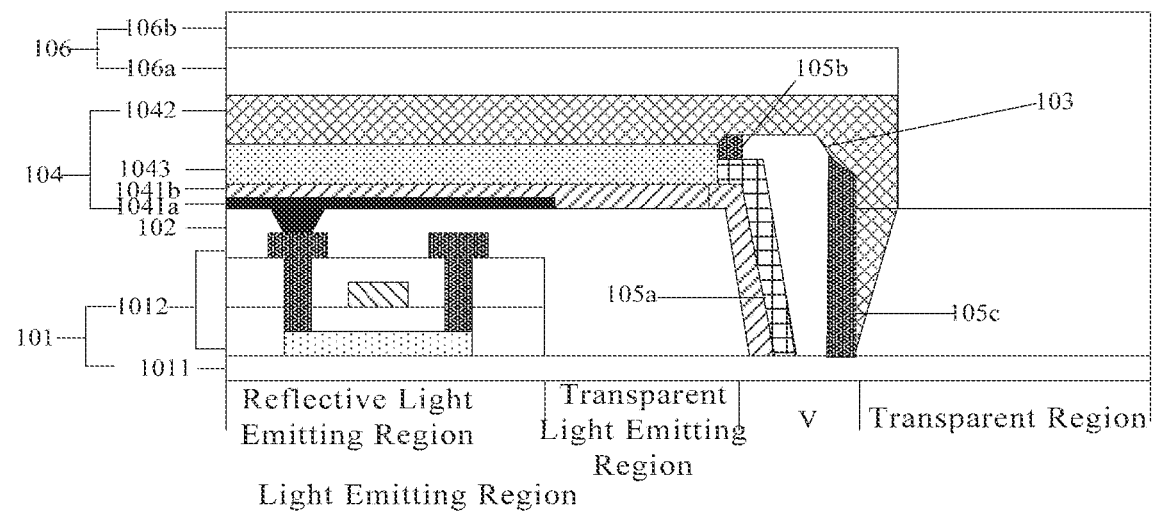

As shown in FIG. 6j, an inorganic material layer is deposited on the first encapsulation layer 106a to form a second encapsulation layer 106b for encapsulating the whole display panel.

At step S511, a cover plate is formed on the second encapsulation layer.

Figure 6K:
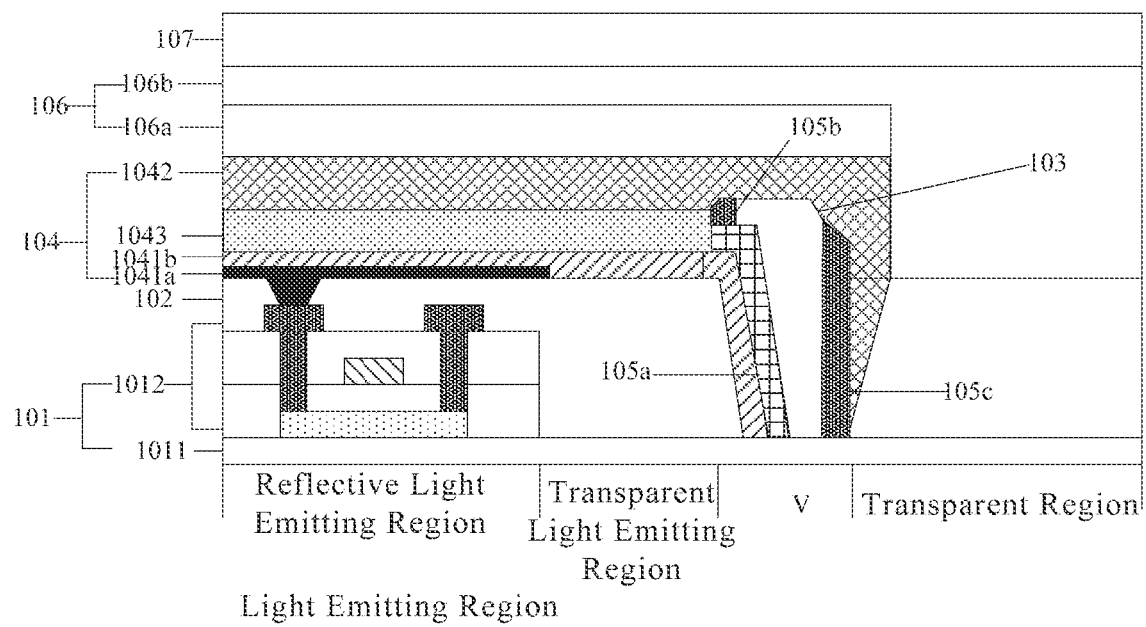

As shown in FIG. 6k, a cover plate 107 is attached to the second encapsulation layer 106b to protect the layers in the display panel and specifically to prevent the layers in the display panel from being damaged by external force during use.

In the method for manufacturing a display panel in the embodiment of the present disclosure, the first electrode 1041 and the second electrode 1042 of the light emitting device 104 may extend from the light emitting region to the separation groove and stop at the separation groove. It is unnecessary to form the first electrode 1041 and the second electrode 1042 in the transparent region, so that the first electrode 1041 and the second electrode 1042 can be prevented from shielding light, and thus the transparency of the display panel can be improved. Moreover, the separation grooves may separate the planarization layer 102 in the light emitting region apart from the planarization layer 102 in the transparent region, thereby preventing moisture or oxygen from penetrating into the organic functional layer of the light emitting device 104 through the planarization layer 102. Meanwhile, the pixel defining layer 103 is formed in the separation groove and the first barrier layer 105a, the second barrier layer 105b, and the third barrier layer 105c surround the side surfaces of the pixel defining layer 103, thereby preventing moisture or oxygen from penetrating into the organic functional layer of the light emitting device 104 through the planarization layer 102. Thus, the reliability and the service life of the display panel can be improved, and the display effect of the display panel can be further improved.

It will be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and essence of the present disclosure, and these changes and modifications are to be considered within the scope of the present disclosure.

What is claimed is:

1. A display panel having a plurality of display regions, each of the display regions having a light emitting region and a transparent region; wherein the display panel comprises a display substrate, and a planarization layer, a pixel defining layer and a light emitting device on the display substrate; the light emitting device comprises a first electrode, a second electrode and an organic functional layer, the first electrode and the second electrode being opposite to each other, and the organic functional layer being between the first electrode and the second electrode, and a separation groove is in the planarization layer between the light emitting region and the transparent region, at least a portion of the pixel defining layer is in the separation groove, both of the first electrode and the second electrode extend to the separation groove from the light emitting region and stops at the separation groove, and the organic functional layer is in a region defined by the pixel defining layer.

2. The display panel of claim 1, wherein
the first electrode covers a sidewall of the separation groove proximal to the light emitting region, and
the second electrode covers a sidewall of the separation groove proximal to the transparent region.

3. The display panel of claim 1, further comprising a first barrier layer, a second barrier layer and a third barrier layer; wherein
the first barrier layer is on a side of the pixel defining layer proximal to the first electrode,
the second barrier layer is on a side of the pixel defining layer proximal to the organic functional layer, and
the third barrier layer is on a side of the pixel defining layer proximal to the second electrode.

4. The display panel of claim 3, wherein
a sum of heights of the first and second barrier layers is less than or equal to a height of the pixel defining layer, and
a height of the third barrier layer is less than or equal to the height of the pixel defining layer.

5. The display panel of claim 3, wherein
each of a corner portion of the second barrier layer and a corner portion of the third barrier layer away from the display substrate has an unfilled corner structure.

6. The display panel of claim 1, further comprising a first encapsulation layer covering the second electrode and a second encapsulation layer stacked on the first encapsulation layer, wherein
the first encapsulation layer extends to the separation groove from the light emitting region and stops at the separation groove, and
the second encapsulation layer extends to the transparent region from the light emitting region.

7. The display panel of claim 6, further comprising a cover plate on a side of the second encapsulation layer away from the display substrate.

8. The display panel of claim 1, wherein
the light emitting region has a reflective light emitting region and a transparent light emitting region, and
the first electrode comprises a reflective layer and a transparent conductive layer on a side of the reflective layer away from the display substrate, the reflective layer being in the reflective light emitting region, and the transparent conductive layer being in both of the reflective light emitting region and the transparent light emitting region.

9. The display panel of claim 8, wherein
a material of the reflective layer comprises at least one of silver, aluminum, and copper, and
a material of the transparent conductive layer comprises at least one of indium tin oxide and indium zinc oxide.

10. The display panel of claim 8, wherein
the display substrate comprises a base substrate and a driving circuit layer on the base substrate, and
the driving circuit layer comprises a plurality of thin film transistors in the reflective light emitting region.

11. The display panel of claim 10, wherein
each of orthographic projections of the plurality of thin film transistors on the base substrate is within an orthographic projection of the reflective layer on the base substrate.

12. The display panel of claim 10, wherein
each of the thin film transistors comprises a plurality of insulating layers that stop at a position between the reflective light emitting region and the transparent light emitting region.

13. A display apparatus, comprising the display panel of claim 1.

14. A method for manufacturing a display panel, the display panel having a plurality of display regions, and each of the plurality of display regions having a light emitting region and a transparent region; wherein the method comprises:
forming a planarization layer on a display substrate, and etching a portion of the planarization layer between the light emitting region and the transparent region to form a separation groove;
forming a first electrode on the planarization layer such that the first electrode stops at the separation groove;
forming a pixel defining layer in the separation groove;
forming an organic functional layer in a region defined by the pixel defining layer;
forming a second electrode on the organic functional layer; and
removing a portion of the second electrode in the transparent region such that the second electrode stops at the separation groove.

15. The method of claim 14, wherein before forming the pixel defining layer in the separation groove, the method further comprises:
forming a first barrier layer on the first electrode in the separation groove.

16. The method of claim 15, wherein after forming the pixel defining layer in the separation groove, the method further comprises:
forming a second barrier layer and a third barrier layer on the pixel defining layer, such that the second barrier layer covers a side surface of the pixel defining layer proximal to the light emitting region and the third barrier layer covers a side surface of the pixel defining layer proximal to the transparent region.

17. The method of claim 14, wherein after forming the second electrode on the organic functional layer, the method further comprises:
forming a first encapsulation layer on the second electrode;
removing portions of the first encapsulation layer and the second electrode in the transparent region; and forming a second encapsulation layer on the first encapsulation layer.

18. The method of claim 17, wherein after forming the second encapsulation layer on the first encapsulation layer, the method comprises:
   attaching a cover plate to the second encapsulation layer.

19. The method of claim 14, wherein forming the organic functional layer in the region defined by the pixel defining layer comprises:
   forming the organic functional layer by using a fine metal mask plate.

20. The method of claim 14, wherein forming the organic functional layer in the region defined by the pixel defining layer comprises:
   forming the organic functional layer through an ink-jet printing process.

* * * * *